United States Patent
Delcol et al.

(10) Patent No.: US 10,207,662 B2
(45) Date of Patent: Feb. 19, 2019

(54) VOLTAGE REGULATION SYSTEM

(71) Applicants: Jean-Pierre Delcol, Tournefeuille (FR); Aurore Desgeorge, Tournefeuille (FR)

(72) Inventors: Jean-Pierre Delcol, Tournefeuille (FR); Aurore Desgeorge, Tournefeuille (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 266 days.

(21) Appl. No.: 14/497,492

(22) Filed: Sep. 26, 2014

(65) Prior Publication Data

US 2015/0097427 A1  Apr. 9, 2015

(30) Foreign Application Priority Data

Oct. 3, 2013  (FR) ...................................... 13 59587

(51) Int. Cl.
  B60R 16/033 (2006.01)
  B60R 16/03 (2006.01)
  (Continued)

(52) U.S. Cl.
  CPC ............ B60R 16/03 (2013.01); H02J 7/0065 (2013.01); H03K 17/08104 (2013.01); H02J 2001/008 (2013.01)

(58) Field of Classification Search
  CPC .............. H02J 7/0065; H02J 2001/008; H03K 7/08104
  See application file for complete search history.

(56) References Cited

U.S. PATENT DOCUMENTS 5,517,379 A    5/1996 Williams et al.
6,175,223 B1 *  1/2001 Martinez ................... G05F 1/46
                                                            323/274
(Continued)

FOREIGN PATENT DOCUMENTS

CN    101853041 A    10/2010
EP     1860774 A1    11/2007
(Continued)

OTHER PUBLICATIONS

French Search Report, dated Apr. 8, 2014, from corresponding FR application.

*Primary Examiner* — Jared Fureman
*Assistant Examiner* — Joel Barnett
(74) *Attorney, Agent, or Firm* — Young & Thompson

(57) ABSTRACT

A voltage regulation system, particularly for a motor vehicle, adapted to be connected to a voltage source in order to provide a regulated voltage $V_{dd}$ to at least one functional component F, the regulation system including a pre-regulator adapted to be connected to a voltage source and a regulator REG including at least one pre-regulation port $P_{PR}$ adapted to be connected to the pre-regulator and one functional port $P_{dd}$ adapted to be connected to a functional component, the regulator including an adaptation device Q directly connecting the pre-regulation port to the functional port of the regulator, the adaptation device consisting of a single MOS power transistor including a drain D, a source S and a gate G. The MOS transistor includes an intrinsic diode DIODE between its drain and its source which is oriented to block the flow of a current between the functional port and the pre-regulation port.

11 Claims, 4 Drawing Sheets

(51) Int. Cl.
*H03K 17/081* (2006.01)
*H02J 7/00* (2006.01)
*H02J 1/00* (2006.01)

(56) References Cited

U.S. PATENT DOCUMENTS

| | | | |
|---|---|---|---|
| 9,441,600 B2* | 9/2016 | Klinkig | F02N 11/0818 |
| 2009/0128219 A1 | 5/2009 | Umemoto | |
| 2011/0012424 A1* | 1/2011 | Wortberg | H02J 1/08 |
| | | | 307/10.1 |
| 2011/0169456 A1 | 7/2011 | Wang et al. | |
| 2012/0139487 A1* | 6/2012 | Kim | B60R 16/033 |
| | | | 320/109 |

FOREIGN PATENT DOCUMENTS

| | | |
|---|---|---|
| EP | 2442419 A2 | 4/2012 |
| FR | 2985966 A1 | 7/2013 |
| JP | 2002-152968 A | 5/2002 |

* cited by examiner

VOLTAGE REGULATION SYSTEM

BACKGROUND OF THE INVENTION

The present invention relates to the field of voltage regulators, in particular, for an automotive application.

DESCRIPTION OF THE RELATED ART

In a known way, with reference to FIG. 1, a motor vehicle comprises a power supply battery BAT connected to a voltage regulation system 1 in order to provide a regulated power supply voltage to a plurality of functional components F1-F3, e.g. fuel injectors. For adapting the power supply voltage provided to the functional components F1-F3, the voltage regulation system 1 ordinarily comprises, for each functional component F1-F3, a voltage pre-regulator PR1-PR3 and a voltage regulator REG1-REG3. As an example, the functional components F1-F3 respectively require power supply voltages $V_{dd1}$, $V_{dd2}$, $V_{dd3}$ equal to 1.9 V, 3.3 V and 5.0 V while the battery voltage $V_{bat}$ is equal to 12 V. Advantageously, the use of a pre-regulator is used to optimize power dissipation in order to obtain a regulation system at a reduced cost.

Each pre-regulator PR1-PR3 allows to deliver a pre-regulated voltage $V_{PR1}$-$V_{PR3}$ from the voltage $V_{bat}$ provided by the battery BAT before supplying the regulator REG1-REG3 with which it is associated. The voltage $V_{PR1}$-$V_{PR3}$ provided by a pre-regulator PR1-PR3 is then adapted by the regulator REG1-REG3 in order to provide a power supply voltage $V_{dd1}$-$V_{dd3}$ adapted to the needs of the functional components F1-F3. To this end, with reference to FIG. 2, a regulator REG comprises at least one pre-regulation port $P_{PR}$ adapted for being connected to a pre-regulator PR and one functional port $P_{dd}$ adapted for being connected to a functional component F.

Ordinarily, a regulator REG comprises an adaptation device Q1 directly connecting the pre-regulation port $P_{PR}$ to the functional port of the regulator $P_{dd}$. The function of the adaptation device Q1 is to provide a power supply voltage $V_{dd}$ to the functional port $P_{dd}$ from the pre-regulated voltage $V_{PR}$ of the pre-regulation port $P_{PR}$.

In the prior art, according to a first embodiment shown in FIG. 2, an adaptation device Q1 comprises a single power transistor NMOS1 which conventionally includes a drain D1, a source S1 and a gate G1.

Ordinarily, the transistor NMOS1 comprises a current flow channel that is modulated by a voltage applied to the gate G1. In addition, transistor NMOS1 intrinsically comprises an internal resistance $R_{DS}$ between its drain D1 and its source S1, known to a person skilled in the art.

In known manner, the transistor NMOS1 intrinsically comprises a diode DIODE1, known as a 'body diode', including a cathode connected to the drain D1 of the transistor NMOS1 and an anode connected to the source S1 of the transistor NMOS1. In normal operation, during regulation, a current flows from the drain D1 to the source S1 via the current flow channel which is modulated by the gate voltage G1.

For precise adjustment of the power supply voltage $V_{dd}$, the drain D1 of the transistor NMOS1 is connected to the pre-regulation port $P_{PR}$ while the source S1 of the transistor NMOS1 is connected to the power supply port $P_{dd}$. According to this configuration, the adaptation device Q1 is adapted for offering a wide range of power supply voltage $V_{dd}$ from a given pre-regulated voltage $V_{PR}$. As an example, the difference between the power supply voltage $V_{dd}$ and the pre-regulated voltage $V_{PR}$ can reach several volts.

Such an adaptation device Q1 does not protect the regulator REG against a possible short circuit at the power supply port $P_{dd}$. Indeed, if the power supply voltage $V_{dd}$ becomes greater than the pre-regulated voltage $V_{PR}$ owing to a short circuit, a short-circuit current $I_{cc}$ can flow through the diode DIODE1 which becomes forward biased, from the power supply port $P_{dd}$ to the pre-regulation port $P_{PR}$, which may damage the regulation system as a whole.

In order to eliminate this drawback, with reference to FIG. 3, an adaptation device Q2 has been proposed consisting of two power transistors NMOS1, NMOS2 placed in series in a 'back to back' arrangement. In the second embodiment of FIG. 3, the adaptation device Q2 consists of a first transistor NMOS1 of which the drain D1 is connected to the pre-regulation port $P_{PR}$ and a second transistor NMOS2 of which the drain D2 is connected to the power supply port $P_{dd}$, the sources S1, S2 of the transistors NMOS1, NMOS2 being connected together.

According to this second embodiment, any short-circuit current $I_{cc}$ from the power supply port $P_{dd}$ is blocked by the diode DIODE2 of the second transistor NMOS2. Indeed, as the second transistor NMOS2 is reversed with respect to the first transistor NMOS1, the diode DIODE2 of the second transistor NMOS2 blocks any current from the power supply port $P_{dd}$. In other words, the second transistor NMOS2 fulfills a function of protecting the regulation system, which is advantageous.

This embodiment nonetheless has the drawback of doubling the internal resistance $R_{DS}$ of the adaptation device Q2 compared with the prior art, which is prejudicial, in particular, for the generation of heat. Indeed, the internal resistances $R_{DS}$ of the transistors NMOS1, NMOS2 add up in series.

Accordingly, to eliminate this drawback, it has been proposed to halve the internal resistance $R_{DS}$ of each transistor NMOS1, NMOS2 in order to obtain a resistance equivalent to the first embodiment of FIG. 2. Nevertheless, such an adaptation device Q2 has a high manufacturing cost. Indeed, the regulator is conventionally formed on a silicon-based ASIC board. The lower the internal resistance of a transistor NMOS1/NMOS2, the larger the surface area of silicon that is used.

Accordingly, compared with the adaptation device Q1 of FIG. 2 consisting of a single transistor NMOS1 of internal resistance $R_{DS}$, an adaptation device Q2 consisting of two transistors NMOS1, NMOS2 of internal resistance $R_{DS}/2$ requires a surface area of silicon four times greater, which has a negative impact on the spatial requirement of the regulation system as well as on its price. Adaptation devices Q1, Q2 have been described with N-channel NMOS power transistors but it goes without saying that the drawbacks are similar with P-channel PMOS power transistors.

BRIEF SUMMARY OF THE INVENTION

The invention aims to provide a regulation system for protecting against a short circuit while having a low manufacturing cost.

To this end, the invention relates to a voltage regulation system, in particular for a motor vehicle, adapted for being connected to a voltage source in order to provide a regulated voltage to at least one functional component, the regulation system comprising:

a pre-regulator adapted for being connected to a voltage source a regulator comprising at least one pre-regulation port adapted for being connected to said pre-regulator and one functional port adapted for being connected to a functional component, said regulator comprising an adaptation device directly connecting the pre-regulation port to the functional port of said regulator, the adaptation device consisting of a single MOS power transistor including a drain, a source and a gate.

The invention is remarkable in that the MOS (NMOS or PMOS) transistor comprises an intrinsic diode, between its drain and its source, which is oriented so as to block the flow of a current between said functional port and said pre-regulation port.

In other words, compared with the second embodiment of FIG. 3, the first power transistor, used for adapting the voltage, has been removed and only the second power transistor, used for protecting against a short circuit, is retained.

Thanks to the invention, a transistor is used 'reversely' in order to protect the circuit while limiting the quantity of silicon consumed. Indeed, compared with the second embodiment of FIG. 3, the quantity of silicon consumed is four times less since the adaptation device consists of a single transistor.

A power transistor used 'reversely' has a narrower adaptation range compared with a power transistor used 'conventionally' as illustrated in FIG. 2. Nevertheless, this feature may be addressed by controlling the pre-regulator.

Preferably, said MOS transistor comprising an intrinsic diode with forward voltage Vdiode, the functional port of the regulator being adapted for receiving a functional voltage Vdd, the pre-regulator is configured for providing the pre-regulation port with a pre-regulation voltage $V_{PR}$ so that:

$$V_{PR} < V_{dd} + V_{diode}$$

In a known way, the forward voltage Vdiode corresponds to the voltage from which the diode allows the flow of a current in its forward-bias direction.

Thus, by imposing a condition on the pre-regulation voltage $V_{PR}$ according to the characteristics of the functional component (Vdd) to be supplied and of the regulator (Vdiode), a robust, protected and low cost regulation system is obtained.

Preferably, the pre-regulator comprising at least one pre-regulation MOS transistor, the regulator comprises a control device adapted for controlling the gate of said pre-regulation MOS transistor so as to set the pre-regulation voltage $V_{PR}$, preferably, in accordance with the mathematical formula above. Thus, the regulator can be used to adjust the pre-regulator according to the functional component to be supplied. The regulation system is advantageously adjustable to fit every type of need.

According to one preferred aspect of the invention, the control device comprises at least one operational amplifier.

According to one aspect of the invention, said MOS transistor of said adaptation device is an N-channel NMOS transistor and the source of said NMOS transistor is connected to the pre-regulation port while the drain of said NMOS transistor is connected to the functional port of said regulator. Such an NMOS transistor has an intrinsic diode oriented so as to block the flow of a current between said functional port and said pre-regulation port.

According to another aspect of the invention, said MOS transistor of said adaptation device is a P-channel PMOS transistor, the source of said PMOS transistor is connected to the functional port while the drain of said PMOS transistor is connected to the pre-regulation port of said regulator. Such a PMOS transistor has an intrinsic diode oriented so as to block the flow of a current between said functional port and said pre-regulation port.

BRIEF DESCRIPTION OF THE DRAWINGS

The invention further relates to a transport vehicle, in particular an automobile, comprising a voltage regulation system as previously described.

The invention will be better understood on reading the following description, given solely by way of example, and by referring to the attached drawings, in which.

DETAILED DESCRIPTION OF THE PREFERRED EMBODIMENTS

It should be noted that the figures display the invention in detail for implementing the invention, said figures obviously serving to better define the invention as appropriate.

Figure 1:
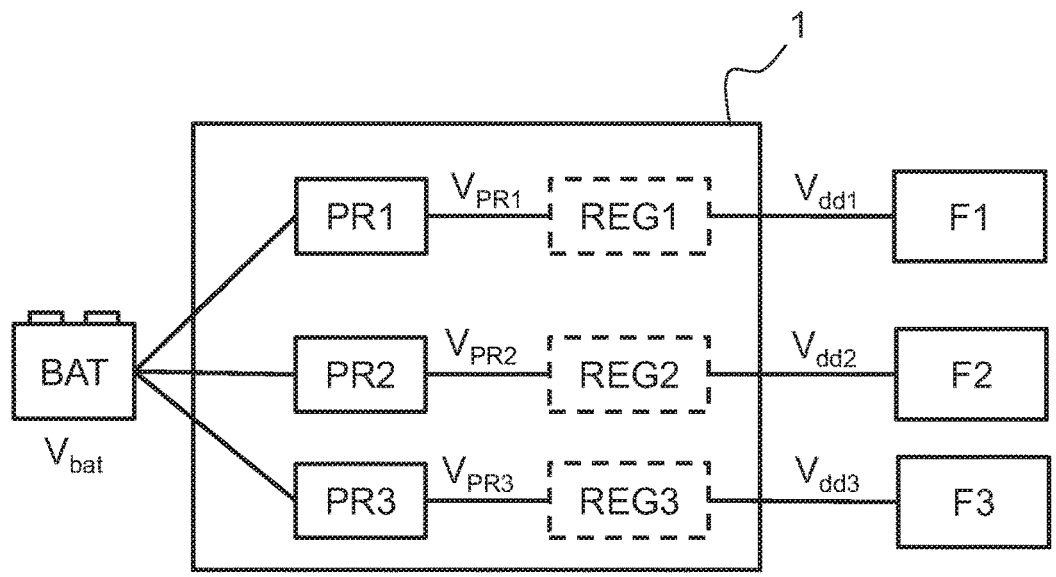
FIG. 1 is a schematic representation of a regulation system connected to a battery and to a functional component.
Figure 2:
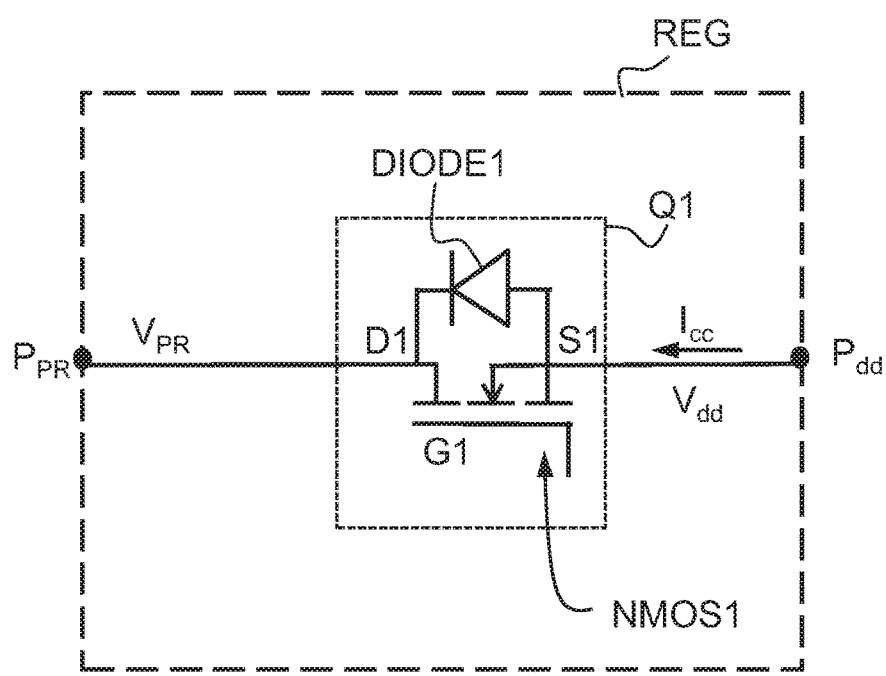
FIG. 2 is a schematic representation of a regulation system comprising a pre-regulator and a regulator including an adaptation device including a single NMOS transistor of which the drain is connected to the pre-regulation port.
Figure 3:
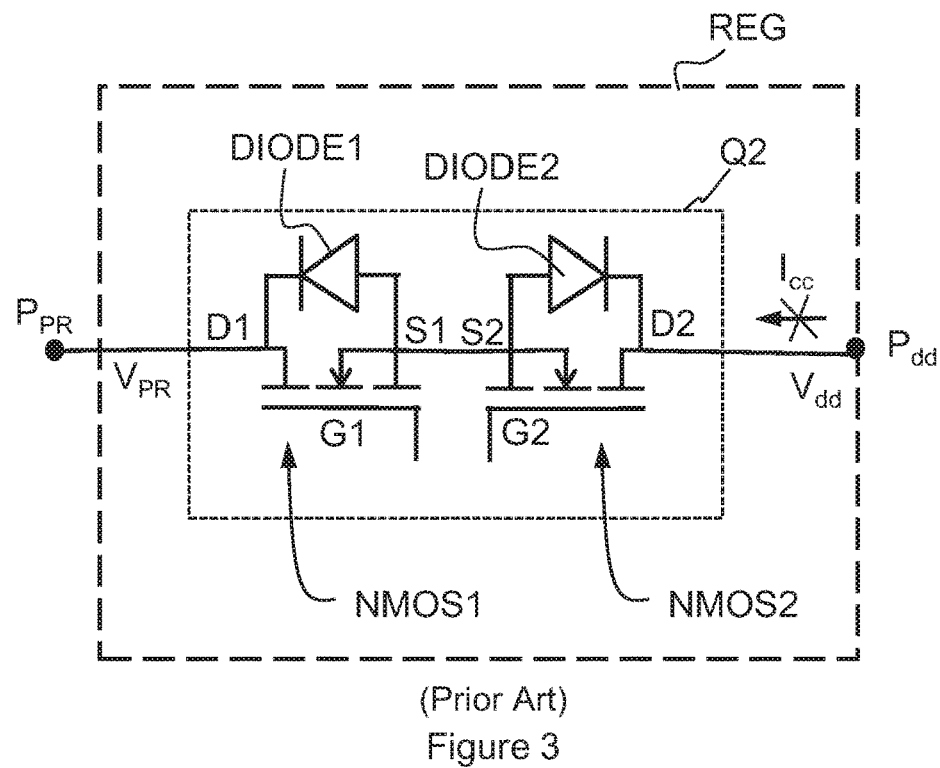
FIG. 3 is a second schematic embodiment of an adaptation device according to the prior art including two NMOS transistors placed 'back to back'.
Figure 4:
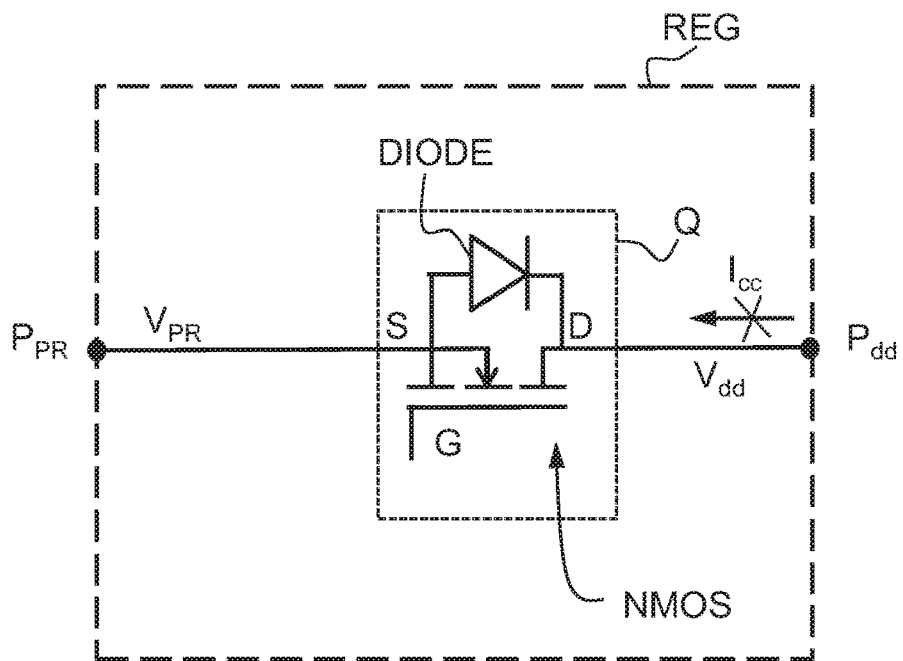
FIG. 4 is a schematic representation of an adaptation device according to an embodiment of the invention with an NMOS transistor.

With reference to FIG. 4, for adapting the power supply voltage provided to the functional components of a motor vehicle, the regulation system 1 comprises for each functional component, a voltage pre-regulator PR and a voltage regulator REG. In this example, the regulation system 1 takes the form of a printed circuit board comprising silicon.

The regulation system 1 comprises a pre-regulator PR adapted for being connected to a voltage source, here a power supply battery BAT, and a regulator REG comprising a pre-regulation port $P_{PR}$ adapted for being connected to said pre-regulator PR and a functional port $P_{dd}$ adapted for being connected to a functional component F.

In this example of embodiment, the regulator REG comprises an adaptation device Q directly connecting the pre-regulation port $P_{PR}$ to the functional port $P_{dd}$ of the regulator REG, the adaptation device Q consisting of a single NMOS power transistor including a drain D, a source S and a gate G. In a known way, the NMOS transistor comprises a current flow channel that is modulated by a voltage applied to the gate G. Furthermore, the NMOS transistor intrinsically comprises an internal resistance $R_{DS}$ between its drain D and its source S, known to a person skilled in the art.

An adaptation device Q with a single NMOS transistor serves to limit the quantity of silicon used for the printed circuit board, which is advantageous.

According to this embodiment of the invention, with reference to FIG. 4, the source S of said NMOS transistor is connected to the pre-regulation port $P_{PR}$ while the drain D of said NMOS transistor is connected to the functional port $P_{dd}$ of said regulator REG.

The NMOS transistor comprises an intrinsic diode DIODE, called a 'body diode' with forward voltage Vdiode, for example, of the order of 0.6 V. Thus, advantageously, when the voltage at the terminals of the diode DIODE is greater than the forward voltage Vdiode, the diode DIODE conducts the current from the source S to the drain D of the NMOS transistor.

When a short-circuit current $I_{cc}$ flows from the drain D to the source S of the NMOS transistor, the diode DIODE blocks its flow. In other words, the NMOS transistor fulfills a function of protecting the regulation system 1, which is advantageous.

In this example of implementation, the functional port $P_{dd}$ of the regulator REG is adapted for receiving a functional voltage $V_{dd}$, the pre-regulator PR is configured for providing the pre-regulation port $P_{PR}$ with a pre-regulation voltage $V_{PR}$ so that:

$$V_{PR} < V_{dd} + V_{diode} \tag{1}$$

Advantageously, such a management of the pre-regulator PR can be used to avoid exceeding the threshold voltage Vdiode while reaching the power supply voltage $V_{dd}$ adapted to the needs of the functional component F.

In other words, by meeting this condition, the current flowing from the source S to the drain D of the NMOS transistor does not flow via the diode DIODE but via the current flow channel that is modulated by the gate G. Thus, the NMOS transistor can control the power supply voltage $V_{dd}$ by modulating the gate voltage G. In addition, any short-circuit current Icc is blocked by the diode DIODE.

Figure 5:
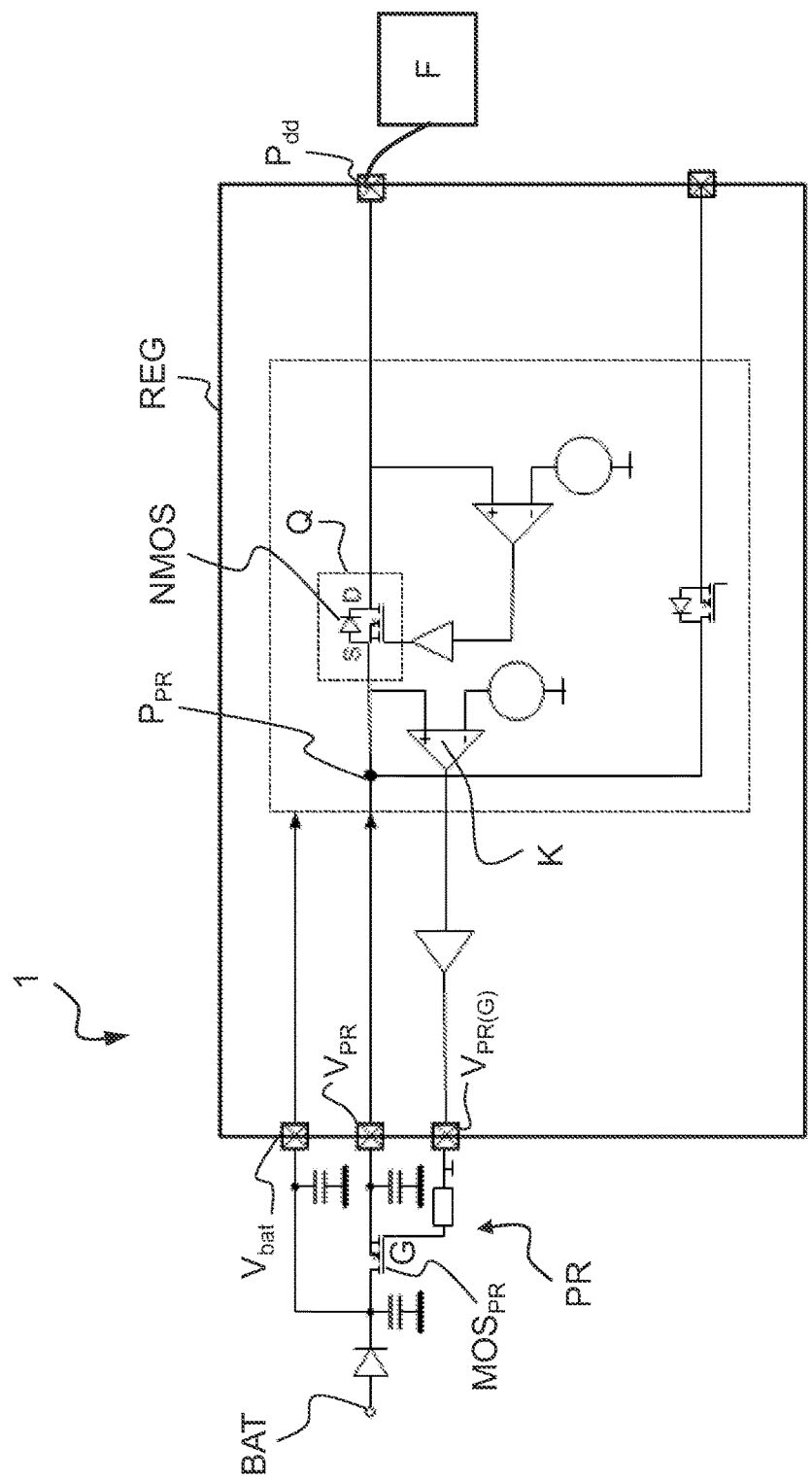
FIG. 5 is a schematic representation of a regulator comprising an adaptation device and a control device according to an embodiment of the invention.

Preferably, with reference to FIG. 5, the regulator REG comprises at least one pre-regulation MOS transistor $MOS_{PR}$ configured for defining the pre-regulation voltage $V_{PR}$, the regulator REG comprises a control device K adapted for regulating the gate G of said pre-regulation MOS transistor $MOS_{PR}$ so as to set the pre-regulation voltage $V_{PR}$ in accordance with the equation (1). In this example, the control device K comprises at least one operational amplifier in order to accurately adjust the pre-regulation voltage V. In this example, the pre-regulation MOS transistor is an NMOS transistor, but it goes without saying that a PMOS transistor could also be suitable.

In other words, the adaptation device Q according to the invention enjoys all of the benefits of the embodiments of the prior art without any disadvantages.

Preferably, the adaptation device Q requires that the pre-regulation voltage $V_{PR}$ is close to the functional voltage $V_{dd}$ whereas such a condition was not necessary in the prior art. Although the adaptation device Q requires better control of the pre-regulation voltage $V_{PR}$, the benefits in terms of protection against a short circuit, compactness and cost are significant. In practice, for equivalent protection, the regulation device Q has a surface area four times less.

The invention is all the more inventive in that it meets a long-felt need in the field of voltage regulation.

Finally, the solution consisting in removing an NMOS transistor from an adaptation device is the opposite of prior art solutions which sought to add new elements to an adaptation device for solving a problem. Thus, it was proposed in the prior art to put two NMOS transistors back to back to prevent a short circuit. A prejudice was thus overcome.

The invention has been described for a voltage regulation application for the power supply of functional components of a motor vehicle, for example, fuel injectors, etc.

Nevertheless, it goes without saying that the invention applies to any voltage regulation system, in particular, in all the fields of transport or industry.

Figure 6:
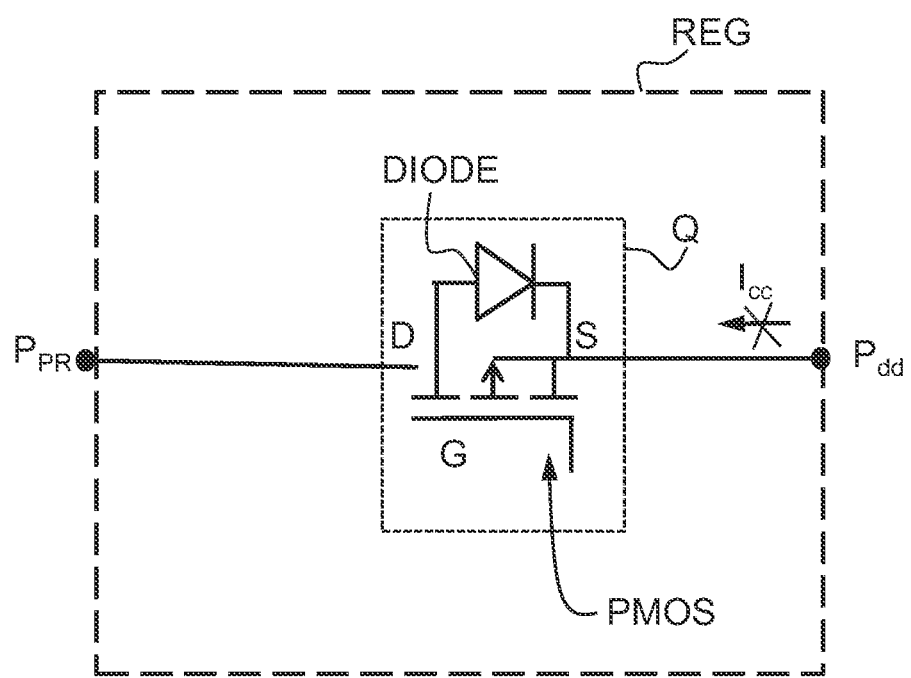
FIG. 6 is a schematic representation of an adaptation device according to an embodiment of the invention with a PMOS transistor.

The invention has been described for an NMOS transistor, i.e. an N-channel MOS transistor. It goes without saying that the invention similarly applies to a P-channel PMOS transistor as illustrated in FIG. 6. According to this configuration, the source S of said PMOS transistor is connected to the functional port $P_{dd}$ while the drain D of said PMOS transistor is connected to the pre-regulation port $P_{PR}$ of said regulator REG.

Likewise, the invention also applies to a DMOS or VDMOS transistor which are particular types of MOS power transistors.

The invention claimed is:

1. A voltage regulation system (1), adapted for being connected to a voltage source (BAT) of a motor vehicle, in order to provide a regulated voltage (Vdd) to at least one functional component (F), the regulation system comprising:
   a pre-regulator (PR) adapted for being connected to a voltage source (BAT); and
   a regulator (REG) comprising at least one pre-regulation port ($P_{PR}$) adapted for being connected to said pre-regulator (PR) and one functional port ($P_{dd}$) adapted for being connected to the at least one functional component (F) of the motor vehicle,
   said regulator (REG) comprising an adaptation device (Q) directly connecting said pre-regulation port ($P_{PR}$) to said functional port ($P_{dd}$) of said regulator (REG),
   said adaptation device (Q) comprising a single MOS power transistor including a drain (D), a source (S) and a gate;
   wherein said single MOS transistor comprises an intrinsic diode (DIODE) between said drain (D) and said source (S) which is oriented so as to block a flow of a current between said functional port ($P_{dd}$) and said pre-regulation port ($P_{PR}$),
   wherein said functional port ($P_{dd}$) of said regulator (REG) is adapted for receiving a functional voltage $V_{dd}$, and said pre-regulator (PR) is configured for providing said pre-regulation port ($P_{PR}$) with a pre-regulation voltage $V_{PR}$ so that:

$$V_{PR} < V_{dd} + V_{diode}.$$

2. The voltage regulation system as claimed in claim 1, wherein said pre-regulator (PR) comprises at least one pre-regulation MOS transistor ($MOS_{PR}$), said regulator comprises a control device (K) adapted for controlling said gate of said pre-regulation MOS transistor ($MOS_{PR}$) so as to adjust said pre-regulation voltage $V_{PR}$.

3. The voltage regulation system as claimed in claim 2, wherein said control device (K) comprises at least one operational amplifier.

4. The voltage regulation system as claimed in claim 1, wherein said single MOS transistor is an N-channel NMOS transistor, said source (S) of said NMOS transistor is connected to said pre-regulation port ($P_{PR}$) while said drain (D) of said NMOS transistor is connected to said functional port ($P_{dd}$) of said regulator (REG).

5. The voltage regulation system as claimed in claim 1, wherein said single MOS transistor is a P-channel PMOS transistor, said source (S) of said PMOS transistor is connected to said functional port ($P_{dd}$) while said drain (D) of said PMOS transistor is connected to said pre-regulation port ($P_{PR}$) of said regulator (REG).

6. A transport vehicle, comprising a voltage regulation system according to claim 1.

7. The voltage regulation system as claimed in claim 2, wherein said single MOS transistor is an N-channel NMOS transistor, said source (S) of said NMOS transistor is connected to said pre-regulation port ($P_{PR}$) while said drain (D) of said NMOS transistor is connected to said functional port ($P_{dd}$) of said regulator (REG).

8. The voltage regulation system as claimed in claim 3, wherein said single MOS transistor is an N-channel NMOS transistor, said source (S) of said NMOS transistor is connected to said pre-regulation port ($P_{PR}$) while said drain (D) of said NMOS transistor is connected to said functional port ($P_{dd}$) of said regulator (REG).

9. The voltage regulation system as claimed in claim 2, wherein said single MOS transistor is a P-channel PMOS transistor, said source (S) of said PMOS transistor is connected to said functional port ($P_{dd}$) while said drain (D) of said PMOS transistor is connected to said pre-regulation port ($P_{PR}$) of said regulator (REG).

10. The voltage regulation system as claimed in claim 3, wherein said single MOS transistor is an N-channel NMOS transistor, said source (S) of said NMOS transistor is connected to said pre-regulation port ($P_{PR}$) while said drain (D) of said NMOS transistor is connected to said functional port ($P_{dd}$) of said regulator (REG).

11. An automobile, comprising a voltage regulation system according to claim 1.

* * * * *